(12) United States Patent
Li et al.

(10) Patent No.: US 9,397,471 B2
(45) Date of Patent: Jul. 19, 2016

(54) HEAT REMOVAL FROM PHOTONIC DEVICES

(71) Applicant: INTEL CORPORATION, Santa Clara, CA (US)

(72) Inventors: Zhihua Li, San Jose, CA (US); Qing Tan, Santa Clara, CA (US); Qinrong Yu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/541,367

(22) Filed: Nov. 14, 2014

(65) Prior Publication Data

US 2016/0141831 A1 May 19, 2016

(51) Int. Cl.

| H01L 23/66 | (2006.01) |
|---|---|
| H01S 5/024 | (2006.01) |
| H01L 31/024 | (2014.01) |
| H01S 5/022 | (2006.01) |
| H01L 31/02 | (2006.01) |
| H01L 31/0232 | (2014.01) |
| H01S 5/02 | (2006.01) |

(52) U.S. Cl.
CPC ...... *H01S 5/02476* (2013.01); *H01L 31/02002* (2013.01); *H01L 31/024* (2013.01); *H01L 31/02325* (2013.01); *H01S 5/0208* (2013.01); *H01S 5/0213* (2013.01); *H01S 5/0228* (2013.01); *H01S 5/02276* (2013.01); *H01S 5/02469* (2013.01)

(58) Field of Classification Search
CPC .............. H01L 23/051; H01L 23/3672; H01L 23/3677; H01L 21/4871; H01L 21/4882; H01L 2023/405; H01L 2023/4043; H01L 23/66; H01L 23/481; H01L 23/36; H01L 23/4334; H01L 23/4093; H01L 23/4006; H01L 2924/3011; H01L 2924/01079; H01L 2924/01078
USPC ......... 257/675, 706, 717, 718, 720, 276, 625, 257/707, 712
See application file for complete search history.

(56) References Cited

U.S. PATENT DOCUMENTS

| 2009/0286382 A1* | 11/2009 | Huff | 438/455 |
|---|---|---|---|
| 2014/0239479 A1* | 8/2014 | Start | 257/706 |
| 2014/0265921 A1* | 9/2014 | Collins | F21V 19/00 315/297 |

* cited by examiner

*Primary Examiner* — Chuong A Luu
(74) *Attorney, Agent, or Firm* — Winkle, PLLC

(57) ABSTRACT

Embodiments of the present description relate to mechanisms for transferring heat through a microelectronic substrate from a photonic device to a heat dissipation device. In one embodiment, the microelectronic substrate may comprise a highly thermally conductive dielectric material. In another embodiment, the microelectronic substrate may comprise a conductive insert within the microelectronic substrate wherein the photonic device is in thermal contact with the conductive insert proximate one surface of the microelectronic substrate and the heat dissipation device is thermal contact with the conductive insert proximate an opposing surface of the microelectronic substrate. In still another embodiment, a stepped heat spreader, having a base portion and a pedestal portion, has the pedestal portion inserted through the microelectronic substrate, wherein the photonic device is in thermal contact with the pedestal portion proximate one surface of the microelectronic substrate and the heat dissipation device is thermal contact with the base portion.

14 Claims, 3 Drawing Sheets

HEAT REMOVAL FROM PHOTONIC DEVICES

TECHNICAL FIELD

Embodiments of the present description generally relate to the removal of heat from microelectronic devices, and, more particularly, to the removal of heat from a photonic device through a substrate to which the photonic device is mounted.

BACKGROUND

Higher performance, lower cost, increased miniaturization of integrated circuit components, and greater packaging density of integrated circuits are ongoing goals of the microelectronic industry. As these goals are achieved, microelectronic devices become smaller. Accordingly, the density of power consumption of the integrated circuit components in the microelectronic devices has increased, which, in turn, increases the average junction temperature of the microelectronic device. If the temperature of the microelectronic device becomes too high, the integrated circuits of the microelectronic device may be damaged or destroyed. This issue becomes even more critical with regard to photonic devices, as the junction temperature limit thereof is about 85° C., which is considerably less the typical electronic device junction temperature limit of about 108° C. This is due to the photonic device using photons, i.e. laser light, rather than electrons, i.e. electrical transmission, for sending and receiving signals, and laser transmissions may become unstable at high temperatures (e.g., temperatures greater than about 85° C.). Therefore, there is a need for ever more effective heat removal solutions for photonic devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
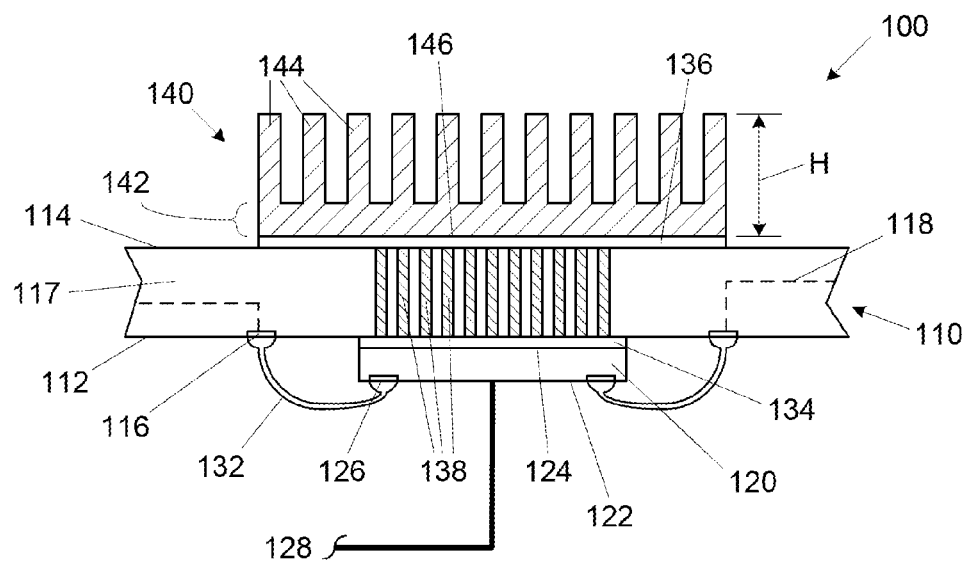
FIG. 1 is a side cross-sectional view of a photonic device, as known in the art.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

FIG. 1 illustrates a photonic package 100, as known in the art. The photonic package 100 may comprise at least one photonic device 120, such as a silicon photonic device, mounted on a microelectronic substrate 110. The microelectronic substrate 110 may be any appropriate substrate, such as an interposer, a motherboard, a daughter board, or the like, having a first surface 112 and an opposing second surface 114. The microelectronic substrate 110 may have a plurality of bond pads, comprising at least one photonic device attachment bond pad 116. The microelectronic substrate 110 may comprise a dielectric material 117 having a plurality of conductive routes 118 (illustrated as dash lines) formed therethrough, wherein the conductive routes 118 may form connections between the photonic device attachment bond pads 116 and other microelectronic devices (not shown) attached to the microelectronic substrate 110, and/or external devices (not shown). In one embodiment of the present description, the dielectric material 117 may be a plurality of layers (not shown).

The microelectronic substrate dielectric material 117 may comprise any appropriate dielectric material, including, by not limited to, liquid crystal polymer, epoxy resin, bismaleimide triazine resin, FR4, polyimide materials, and the like. The conductive routes 118 may be formed of any appropriate conductive material, including, but not limited to, copper, silver, gold, nickel, and alloys thereof. It is understood that the microelectronic substrate 110 may be formed from any number of dielectric layers, may contain a rigid core (not shown), and may contain active and/or passive microelectronic devices (not shown) formed therein. It is further understood that the conductive routes 118 could form any desired electrical route within the microelectronic substrate 110 and/or with additional external components (not shown). The processes used for forming the microelectronic substrate 110 are well known to those skilled in the art, and for the sake of brevity and conciseness will not be described or illustrated herein.

As further shown in FIG. 1, a back surface 124 of the photonic device 120 may be attached to the microelectronic substrate first surface 112 with a thermally conductive attachment material 134, such as a conductive filled epoxy. The photonic device 120 may be electrically connected to the microelectronic substrate 110 with at least one bond wire 132 extending between at least one bond pad 126 formed in or on an active surface 122 of the photonic device 120 and at least one photonic device attachment bond pad 116 of the microelectronic substrate 110. It is understood that the photonic device bond pads 126 may be in electrical communication with integrated circuitry (not shown) within the photonic device 120.

For the purposes of the present description, a photonic device 120 may be defined as a device which translates electrical signals into photonic signals (i.e., a transmitting device) and/or which translates photonic signals into electrical signals (i.e., a receiving device). Therefore, an optical transmission line (shown generically as a line 128) would also be coupled to the photonic device 120.

A heat dissipation device 140 may be in thermal contact with the microelectronic substrate second surface 114. The heat dissipation device 140 may have a base portion 142 having a surface 146 that is in thermal contact with the microelectronic substrate second surface 114, and a plurality of high surface area projections 144, such a fins or pillars, extending from the base portion 142 to improve the thermal dissipation properties of the heat dissipation device 140, as will be understood to those skilled in the art. The heat dissipation device 140 may be made of any appropriate thermally conductive material, such a metals and alloys, including, but not limited to, copper, aluminum, and the like. A thermal interface material 136, such as a thermally conductive grease or polymer, may be disposed between the heat dissipation device base surface 146 and the microelectronic substrate second surface 114.

As further illustrated in FIG. 1, a plurality of thermally conductive vias 138 may be formed through the microelectronic substrate 110, extending from the microelectronic substrate first surface 112 to the microelectronic substrate second surface 114 to conduct heat from the photonic device 110 to the heat dissipation device 140. The thermally conductive vias 138 may be formed from any appropriate material, including, but not limited to copper, aluminum, conductive polymers, and the like. The processes used for forming the thermally conductive vias 138 are well known to those skilled in the art, and for the sake of brevity and conciseness will not be described or illustrated herein.

Although the thermally conductive vias 138 may reduce the thermal resistance of the microelectronic substrate 110, the microelectronic substrate 110 may still constitute about 30% or more of the total thermal resistance. Furthermore, the fabrication of the thermally conductive vias 138 may cause up to about 20 μm in height variation at the microelectronic substrate first surface 112 and the microelectronic substrate second surface 114 when copper plating used, and, when filled epoxy materials are used, uneven surfaces, such as bumps and dimples, may occur at the microelectronic substrate first surface 112 and the microelectronic substrate second surface 114 that may have the potential risk of epoxy voiding.

In applications such as servers, multiple photonic packages 100 may be aligned side-by-side and/or back-to-back. Such applications limit the height H of the heat dissipation device 140, thus the heat dissipation device height H needs to be reduced. Therefore, it is important improve the thermal management of photonic packages 100 with an improvement of the thermal conductivity between the silicon photonic device 120 and the heat dissipation device 140 in order to reduce the heat dissipation device height H.

Figure 2:
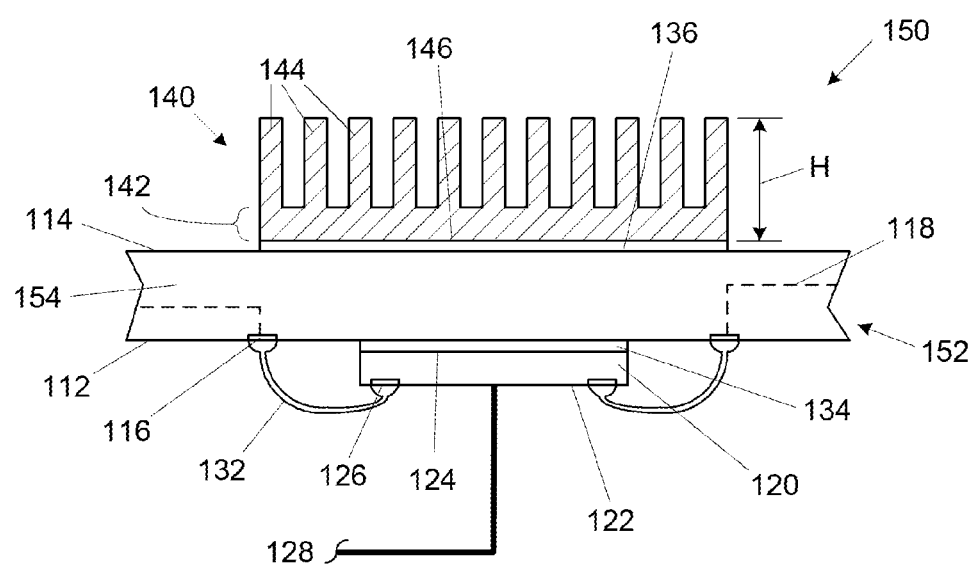
FIG. 2 is a side cross-sectional view of a photonic device having a highly thermally conductive substrate, according to an embodiment of the present description.

Embodiments of the present description relate to more efficient mechanisms for transferring heat through a microelectronic substrate from a silicon photonic device to a heat dissipation device. In one embodiment, as illustrated in FIG. 2, the thermally conductive vias 138 shown in FIG. 1 may be eliminated with the formation of a highly conductive microelectronic substrate 152. The microelectronic substrate 110 may be formed from a highly thermally conductive dielectric material 154 compared to the relatively low thermally conductive material currently used in the industry. In an embodiment, the microelectronic substrate dielectric material 154 may be a ceramic material, including, but not limited to as aluminum oxide, aluminum nitride, beryllium oxide, and the like. For example, aluminum oxide, such as alumina 94 (94% purity), may have thermal conductivity of about 18 W/mK or greater. When compared with materials currently used in the fabrication of microelectronic substrates, such as FR4 which may have a thermal conductive of 0.3 W/mK or less, it can be seen that the microelectronic substrate 152 can effectively transfer heat between the photonic device 120 and the heat dissipation device 140 without the need for the thermally conductive vias 138 shown in FIG. 1.

Figure 3:
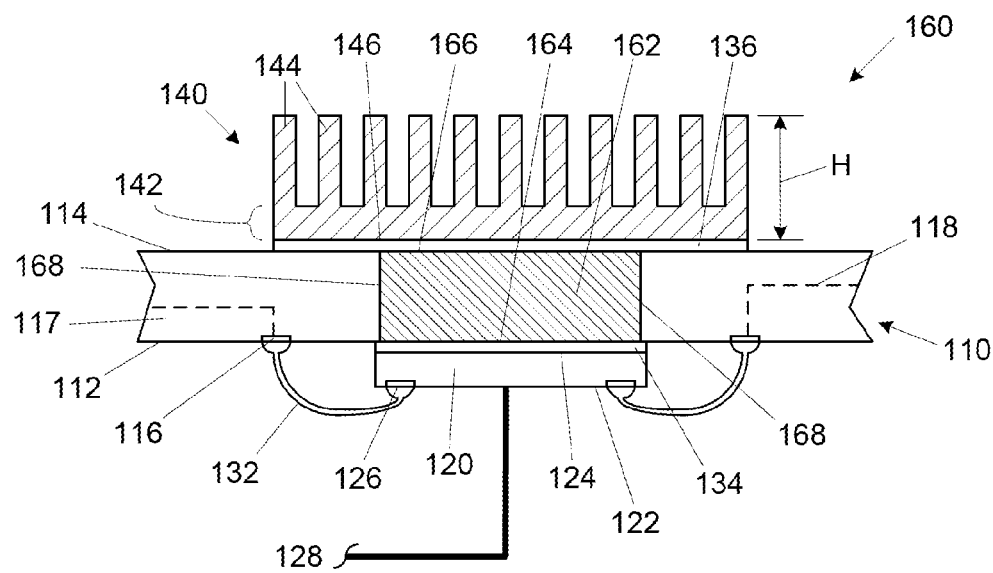
FIG. 3 is a side cross-sectional view of a photonic device having a thermally conductive insert embedded in a substrate, according to another embodiment of the present description.

In another embodiment, as shown in FIG. 3, a conductive insert 162 may be positioned within the microelectronic substrate 110 in the formation of a photonic package 160. The conductive insert 162 may have a first surface 164, an opposing second surface 166, and at least one sidewall 168 extending between the conductive insert first surface 164 and the conductive insert second surface 166. The conductive insert first surface 164 may be substantially planar to the microelectronic substrate first surface 112, the conductive insert second surface 166 may be substantially planar to the microelectronic substrate second surface 114, and the conductive insert sidewall(s) 168 may abut the microelectronic substrate 110. The conductive insert 162 may be made of any appropriate conductive material, including, but not limited to, metals (such as copper, aluminum, alloys thereof, and the like) and ceramics (such as aluminum nitride, aluminum oxide, beryllium oxide, and the like). The conductive insert 162 may also includes structures such as vapor chambers (not shown), as will be understood to those skilled in the art. The conductive insert 162 may be incorporated into the microelectronic substrate 110 may any known means in the art, including, but not limited to, cutting an opening in the microelectronic substrate 110 and inserting the conductive insert 162 therein, or forming the microelectronic substrate 110 around the conductive insert 162, as will be understood to those skilled in the art.

Figure 4:
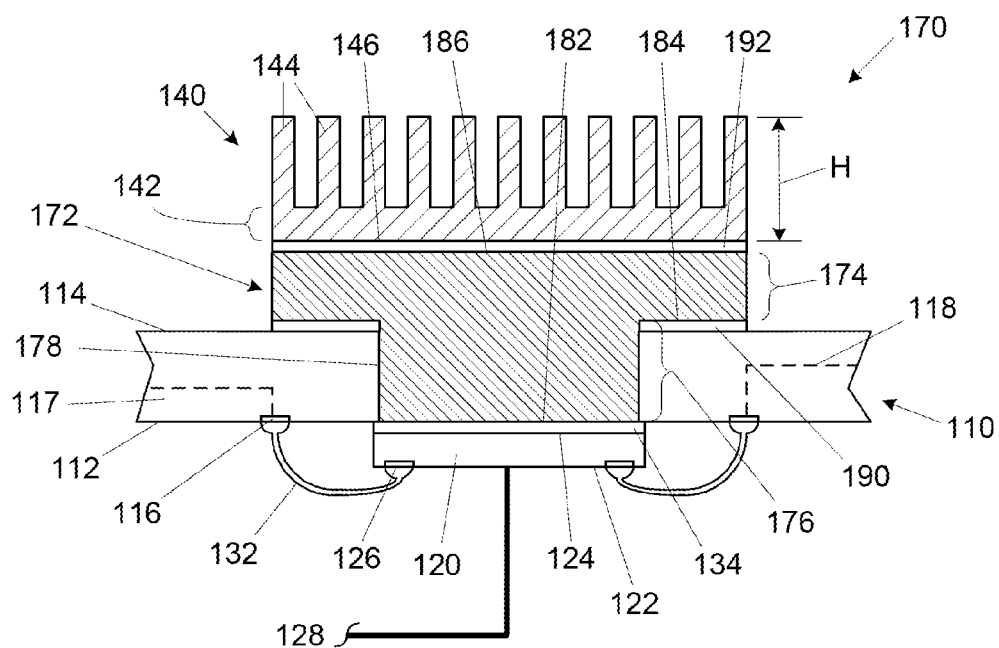
FIG. 4 is a side cross-sectional view of a photonic device having a stepped heat spreader incorporated in a substrate, according to still another embodiment of the present description.

In still another embodiment, as shown in FIG. 4, a stepped heat spreader 172 may be utilized with the microelectronic substrate 110 in the formation of a photonic package 170. The stepped heat spreader 172 may comprise a base portion 174 and a pedestal portion 176 extending from the stepped heat spreader base portion 174. The stepped heat spreader base portion 174 may include a first surface 184, adjacent the stepped heat spreader pedestal portion 176, and an opposing second surface 186. The stepped heat spreader pedestal portion 176 may have a first surface 182 and at least one sidewall 178 extending between the stepped heat spreader base portion first surface 184 and the stepped heat spreader pedestal portion first surface 182. The stepped heat spreader pedestal portion first surface 182 may be substantially planar to the microelectronic substrate first surface 112 and the stepped heat spreader pedestal portion sidewall(s) 178 may abut the microelectronic substrate 110. The stepped heat spreader base portion first surface 184 may be substantially planar to the microelectronic substrate second surface 114, and a thermal interface attachment material 190 may be disposed between the stepped heat spreader base portion first surface 184 and the microelectronic substrate second surface 114. In one embodiment, the thermal interface attachment material 190 may be a phase change thermal interface material, which may have a high tackiness of adhesion. The stepped heat spreader 172 may be made of any appropriate conductive material, including, but not limited to, metals (such as copper, aluminum, alloys thereof, and the like) and ceramics (such as aluminum nitride, aluminum oxide, beryllium oxide, and the like). The stepped heat spreader 172 may also includes structures such as vapor chambers (not shown), as will be understood to those skilled in the art. The stepped heat spreader 172 may be incorporated into the microelectronic substrate 110 may any known means in the art, including, but not limited to, cutting an opening in the microelectronic substrate 110 and inserting the stepped heat spreader pedestal portion 176 therein, as will be understood to those skilled in the art.

As further shown in FIG. 4, the heat dissipation device base surface 146 may be in thermal contact the stepped heat spreader base portion second surface 186 with a thermal interface material 192 disposed therebetween.

With the known design shown in FIG. 1, a junction-to-case temperature difference may be about 11.4° C., wherein the junction temperature is defined to be temperature of the laser within the photonic device 120 and the case temperature is the temperature in a center portion of the heat dissipation device base surface 146. Each of the embodiments of FIGS. 2, 3, and 4 show a junction-to-case temperature difference of about 8° C., which is about a 30% temperature differential reduction. Thus, as will be understood to those skilled in the art, the height of the heat dissipation device 140 may be reduced while maintaining the same junction temperature. Further, the elimination of the conductive vias 138 of FIG. 1 in the embodiments of FIGS. 2, 3, and 4 will eliminate height variation caused by the conductive vias 138 of FIG. 1, which may assist in reducing the height of the overall photonic device 150, 160, and 170.

Figure 5:
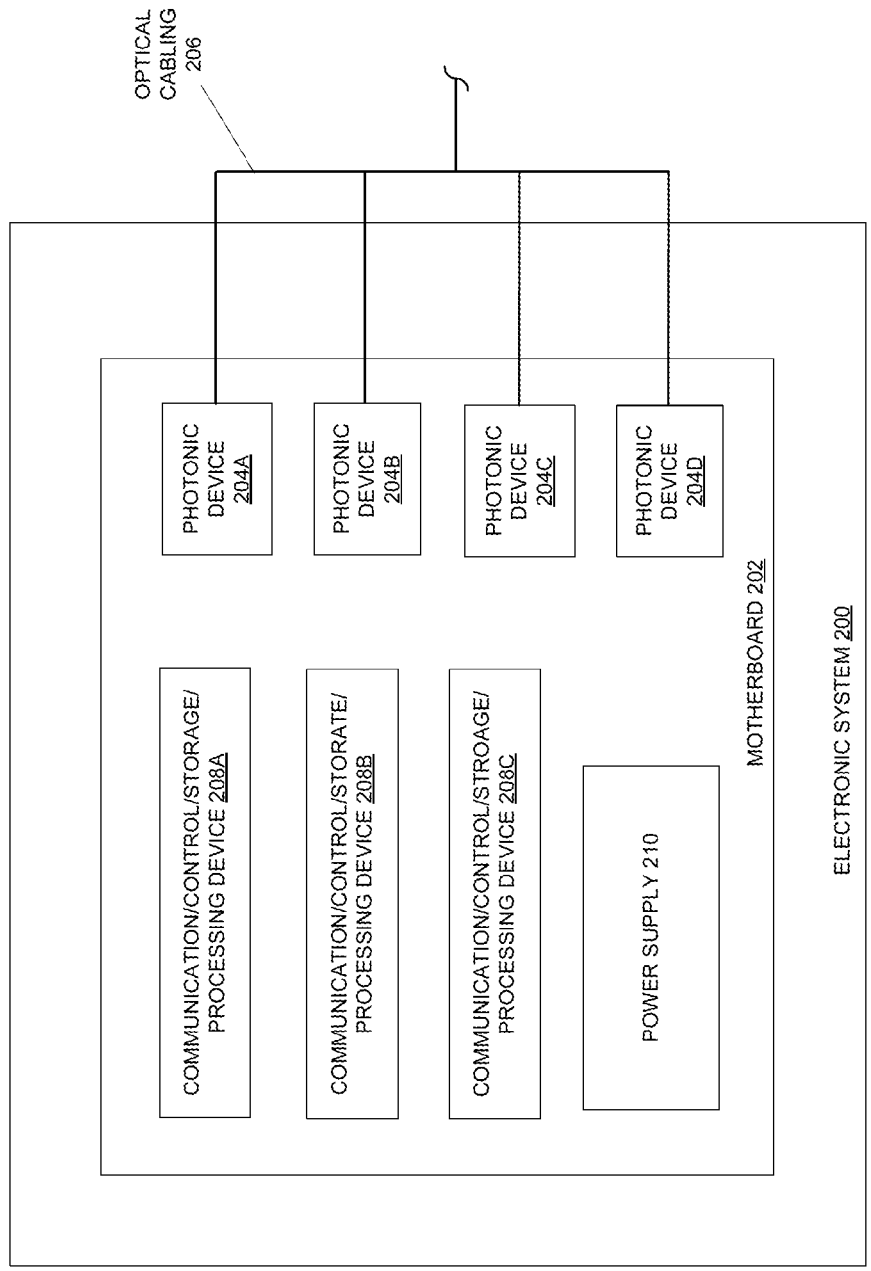
FIG. 5 is an electronic device/system, according to embodiments of the present description.

FIG. 5 illustrates an electronic system 200, such as a server assembly component, in accordance with one implementation of the present description. The electronic system 200 may include a motherboard 202. The motherboard 202 may include a number of photonic devices (shown generically as photonic device 204A, 204B, 204C, and 204D). The motherboard 202 may further include a number of components, including but not limited to a communication devices, control devices, storage devices, and processing devices (shown generically as communication/control/storage/processing device 208A, 208B, and 208C) and an onboard power supply 210 electrically coupled to the motherboard 202. In some implementations of the present description, at least one of the communication/control/storage/processing devices 208A, 208B, and 208C may be electrically coupled to at least one other of the communication/control/storage/processing devices 208A, 208B, and 208C and/or at least one of the photonic devices 204A, 204B, 204C, 204D through the motherboard 202. As further illustrated in FIG. 5, optical cabling 206 may be in photonic communication with the photonic devices 204A, 204B, 204C, 204D for communication with external devices (not shown). At least one of the photonic devices 204A, 204B, 204C, 204D may incorporate the thermally solutions discussed with regard to FIGS. 2, 3, and 4.

It is understood that the subject matter of the present description is not necessarily limited to specific applications illustrated in FIGS. 1-5. The subject matter may be applied to other microelectronic device and assembly applications, as well as any appropriate heat removal application, as will be understood to those skilled in the art.

The following examples pertain to further embodiments, wherein Example 1 is a photonic package, comprising a microelectronic substrate having a first surface and an opposing second surface; a photonic device proximate to the microelectronic substrate first surface, wherein the photonic device includes an active surface and an opposing back surface; a stepped heat spreader comprising a base portion and a pedestal portion extending from the base portion, wherein the pedestal portion extends through the microelectronic substrate; wherein the stepped heat spreader base portion is proximate the microelectronic substrate second surface and wherein the stepped heat spreader pedestal portion includes a first surface that is substantially planar to the microelectronic substrate first surface; and wherein the photonic device back surface is in thermal contact with the stepped heat spreader pedestal portion first surface.

In Example 2, the subject matter of Example 1 can optionally include the photonic device back surface being thermally attached to the stepped heat spreader pedestal portion first surface with a thermally conductive attachment material.

In Example 3, the subject matter of either Example 1 or 2 can optionally include the stepped heat spreader base portion including a first surface adjacent the stepped heat spreader pedestal portion and a second surface opposing the first surface.

In Example 4, the subject matter of Example 3 can optionally include a heat dissipation device thermally attached to the stepped heat spreader base portion second surface.

In Example 5, the subject matter of either Example 3 or 4 can optionally include the stepped heat spreader base portion first surface being attached to the microelectronic substrate second surface.

In Example 6, the subject matter of any of Examples 1 to 5 can optionally include the photonic device being electrically connected to the microelectronic substrate.

In Example 7, the subject matter of Example 6 can optionally include the photonic device being electrically connected to the microelectronic substrate first surface by at least one bond wire extending from the photonic device active surface to the microelectronic substrate first surface.

In Example 8, the subject matter of any of Examples 1 to 7 can optionally include an optical transmission line coupled to the photonic device.

The following examples pertain to further embodiments, wherein Example 9 is a photonic package, comprising a microelectronic substrate having a first surface and an opposing second surface; a conductive insert positioned within the microelectronic substrate, wherein the conductive insert includes a first surface that is substantially planar to the microelectronic substrate first surface and a second surface that is substantially planar to the microelectronic substrate second surface; a photonic device proximate the microelectronic substrate first surface, wherein the photonic device includes an active surface and an opposing back surface; and a heat dissipation device proximate the microelectronic substrate second surface; wherein the photonic device back surface is in thermal contact with the conductive insert first surface and wherein heat dissipation device is in thermal contact with the conductive insert second surface.

In Example 10, the subject matter of Example 9 can optionally include the photonic device back surface being thermally attached to the conductive insert first surface with a thermally conductive attachment material.

In Example 11, the subject matter of either Example 9 or 10 can optionally include a thermal interface material between the heat dissipation device and the conductive insert second surface.

In Example 12, the subject matter of any of Examples 9 to 11 can optionally include the photonic device being electrically connected to the microelectronic substrate.

In Example 13, the subject matter of Example 12 can optionally include the photonic device being electrically connected to the microelectronic substrate first surface by at least one bond wire extending from the photonic device active surface to the microelectronic substrate first surface.

In Example 14, the subject matter of any of Examples 9 to 13 can optionally include an optical transmission line coupled to the photonic device.

The following examples pertain to further embodiments, wherein Example 15 is a photonic package, comprising a microelectronic substrate having a first surface and an opposing second surface, wherein the microelectronic substrate comprises a plurality of conductive routes and a dielectric material having a thermal conductivity of about 18 W/mK or greater; a photonic device including an active surface and an opposing back surface, wherein the photonic device back surface is thermally attached to the microelectronic substrate first surface; and a heat dissipation device thermally attached to the microelectronic substrate second surface.

In Example 16, the subject matter of Example 15 can optionally include the microelectronic substrate comprising a ceramic material.

In Example 17, the subject matter of Example 16 can optionally include the microelectronic substrate comprising aluminum oxide.

In Example 18, the subject matter of any of Examples 15 to 17 can optionally include the photonic device back surface being thermally attached to the microelectronic substrate first surface with a thermally conductive attachment material.

In Example 19, the subject matter of any of Examples 15 to 18 can optionally include a thermal interface material between the heat dissipation device and the microelectronic substrate second surface.

In Example 20, the subject matter of any of Examples 15 to 19 can optionally include the photonic device being electrically connected to the microelectronic substrate.

In Example 21, the subject matter of Example 20 can optionally include the photonic device being electrically connected to the microelectronic substrate first surface by at least one bond wire extending from the photonic device active surface to the microelectronic substrate first surface.

In Example 22, the subject matter of any of Examples 15 to 22 can optionally include an optical transmission line coupled to the photonic device.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A photonic package, comprising:
   a microelectronic substrate having a first surface and an opposing second surface;
   a photonic device proximate to the microelectronic substrate first surface, wherein the photonic device includes an active surface and an opposing back surface;
   a stepped heat spreader comprising a base portion and a pedestal portion extending from the base portion, wherein the pedestal portion extends through the microelectronic substrate;
   wherein the stepped heat spreader base portion is proximate the microelectronic substrate second surface and wherein the stepped heat spreader pedestal portion includes a first surface that is substantially planar to the microelectronic substrate first surface; and
   wherein the photonic device back surface is in thermal contact with the stepped heat spreader pedestal portion first surface.

2. The photonic package of claim 1, wherein the photonic device back surface is thermally attached to the stepped heat spreader pedestal portion first surface with a thermally conductive attachment material.

3. The photonic package of claim 1, wherein the stepped heat spreader base portion includes a first surface adjacent the stepped heat spreader pedestal portion and a second surface opposing the first surface.

4. The photonic package of claim 3, further including a heat dissipation device thermally attached to the stepped heat spreader base portion second surface.

5. The photonic package of claim 3, wherein the stepped heat spreader base portion first surface is attached to the microelectronic substrate second surface.

6. The photonic package of claim 1, wherein the photonic device is electrically connected to the microelectronic substrate.

7. The photonic package of claim 6, wherein the photonic device is electrically connected to the microelectronic substrate first surface by at least one bond wire extending from the photonic device active surface to the microelectronic substrate first surface.

8. The photonic package of claim 1, further including an optical transmission line coupled to the photonic device.

9. A photonic package, comprising:
   a microelectronic substrate having a first surface and an opposing second surface;
   a conductive insert positioned within the microelectronic substrate, wherein the conductive insert includes a first surface that is substantially planar to the microelectronic substrate first surface and a second surface that is substantially planar to the microelectronic substrate second surface;
   a photonic device proximate the microelectronic substrate first surface, wherein the photonic device includes an active surface and an opposing back surface; and
   a heat dissipation device proximate the microelectronic substrate second surface;
   wherein the photonic device back surface is in thermal contact with the conductive insert first surface and wherein heat dissipation device is in thermal contact with the conductive insert second surface.

10. The photonic package of claim 9, wherein the photonic device back surface is thermally attached to the conductive insert first surface with a thermally conductive attachment material.

11. The photonic package of claim 9, further including a thermal interface material between the heat dissipation device and the conductive insert second surface.

12. The photonic package of claim 9, wherein the photonic device is electrically connected to the microelectronic substrate.

13. The photonic package of claim 12, wherein the photonic device is electrically connected to the microelectronic substrate first surface by at least one bond wire extending from the photonic device active surface to the microelectronic substrate first surface.

14. The photonic package of claim 9, further including an optical transmission line coupled to the photonic device.

* * * * *